United States Patent [19]

Havel

[11] Patent Number: 4,831,326
[45] Date of Patent: May 16, 1989

[54] DIGITAL VOLTMETER WITH VARIABLE COLOR BACKGROUND

[76] Inventor: Karel Havel, P.O. Box 66, Station M, Toronto, Ontario, Canada, M6S 4T2

[21] Appl. No.: 940,100

[22] Filed: Dec. 10, 1986

[51] Int. Cl.[4] .................. G01R 15/08; G01R 19/26
[52] U.S. Cl. .................................... 324/115; 324/120
[58] Field of Search .................. 324/115, 73 R, 120, 324/96; 340/756, 701, 704

[56] References Cited

U.S. PATENT DOCUMENTS

| | | | |
|---|---|---|---|
| 2,643,344 | 6/1953 | McLaren et al. | 324/115 |
| 2,648,015 | 8/1953 | Greenfield et al. | 324/115 |
| 2,682,000 | 6/1954 | Clayton et al. | 324/115 |
| 4,438,498 | 3/1984 | Sekel et al. | 364/483 |

Primary Examiner—Ernest F. Karlsen

[57] ABSTRACT

A digital voltmeter includes a display device surrounded by a variable color background area for indicating measured voltage in a digital format. The color of the background area is controlled in accordance with the significance of measured voltage.

2 Claims, 6 Drawing Sheets 4,831,326

DIGITAL VOLTMETER WITH VARIABLE COLOR BACKGROUND

CROSS-REFERENCE TO RELATED APPLICATIONS

This is a continuation-in-part of my copending application Ser. No. 06/882,430, now U.S. Pat. No. 4,734,619, entitled Display Device with Variable Color Background.

This also relates to my copending application Ser. No. 06/819,111 filed on Jan. 15, 1986, now U.S. Pat. No. 4,794,383, entitled Variable Color Digital Multimeter and to my copending application Ser. No. 06/946,036 filed on Dec. 24, 1986, entitled Variable Color Analog Voltmeter.

BACKGROUND OF THE INVENTION

1. Field of the Invention

This invention relates to digital measuring devices utilizing a display with variable color background.

2. Description of the Prior Art

Commercially available measuring instruments with monochromatic digital readout are capable of performing measurements and displaying results at a relatively fast rate. However, to determine the significance of measured values, an operator must rapidly read displayed values, perform mental comparisons with predetermined limits, and take actions accordingly. The task is much more complicated when the limits are variable.

SUMMARY OF THE INVENTION

Accordingly, it is the principal object of this invention to provide an improved digital measuring device for facilitating the prompt recognition of significance of measured values.

It is another object of the invention to provide a digital measuring device employing a variable color character display with integral variable color background area.

In summary, a digital measuring device of the invention includes a display on which measured values of voltage may be indicated in a character format. The display is substantially surrounded by a variable color background area which may be illuminated in a color in accordance with the significance of the measured value.

Further objects of the invention will become obvious from the accompanying drawings and their description.

BRIEF DESCRIPTION OF THE DRAWINGS

In the drawings in which are shown the preferred embodiments of the invention.

Throughout the drawings, like characters indicate like parts.

DESCRIPTION OF THE PREFERRED EMBODIMENTS

Figure 1:
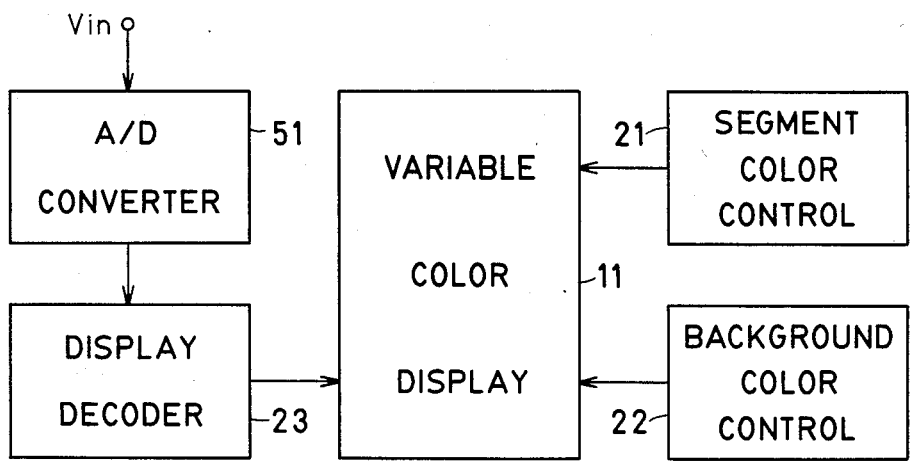
FIG. 1 is a block diagram of a digital voltmeter utilizing a display with variable color background.

Referring now, more particularly, to the drawings, in FIG. 1 is shown a block diagram of a digital voltmeter utilizing a variable color display surrounded by a variable color background area. The digital voltmeter includes an A/D (analog to digital) converter 51, for converting an analog signal Vin applied to its input to digital data, and a display decoder 23 for causing the digital data to be displayed in a character format on a variable color display 11. As will be more specifically pointed out subsequently, the display 11 includes variable color display areas arranged in a pattern and integral variable color background area. The invention resides in the addition of a segment color control 21 for illuminating the display areas in a suitable color and a background color control 22 for illuminating the background area in a color related to the measured value. The digital voltmeter of this invention can thus simultaneously indicate the measured value, in a character format, and its significance, in a color of the display background. By way of an example, measured value that is considered to be normal may be indicated on green background, measured value that is slightly abnormal may be indicated on blue background, and measured value that is critical may be indicated on red background.

Figure 2:
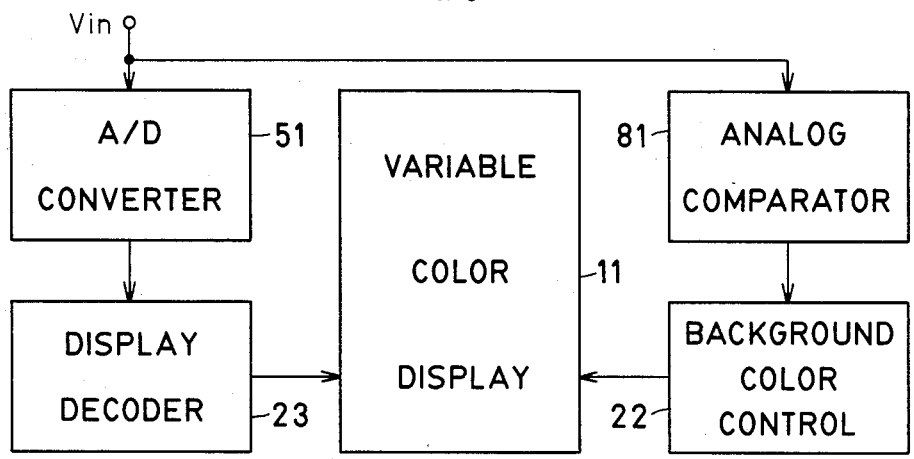
FIG. 2 is a block diagram of a variable color background digital voltmeter with an analog comparator.

In FIG. 2 is shown a block diagram of a like digital voltmeter characterized by an analog comparator 81. The input of analog comparator 81 is coupled to the input of A/D converter 51 for comparing the input signal with predetermined limits and for developing comparison signals accordingly. The background color control 22 illuminates the background area of the display in accordance with the comparison signals.

Figure 3:
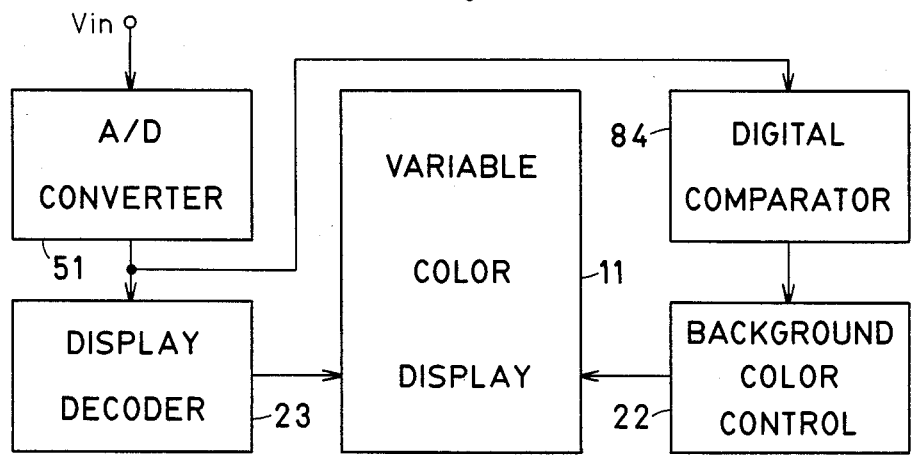
FIG. 3 is a block diagram of a variable color background digital voltmeter with a digital comparator.

In FIG. 3 is shown a block diagram of a like digital voltmeter characterized by a digital comparator 84. The input of digital comparator 84 is coupled to the output of A/D converter 51 for comparing the output digital data with predetermined limits and for developing comparison signals accordingly. The background color control 22 illuminates the background area of the display in accordance with the comparison signals.

Figure 4:
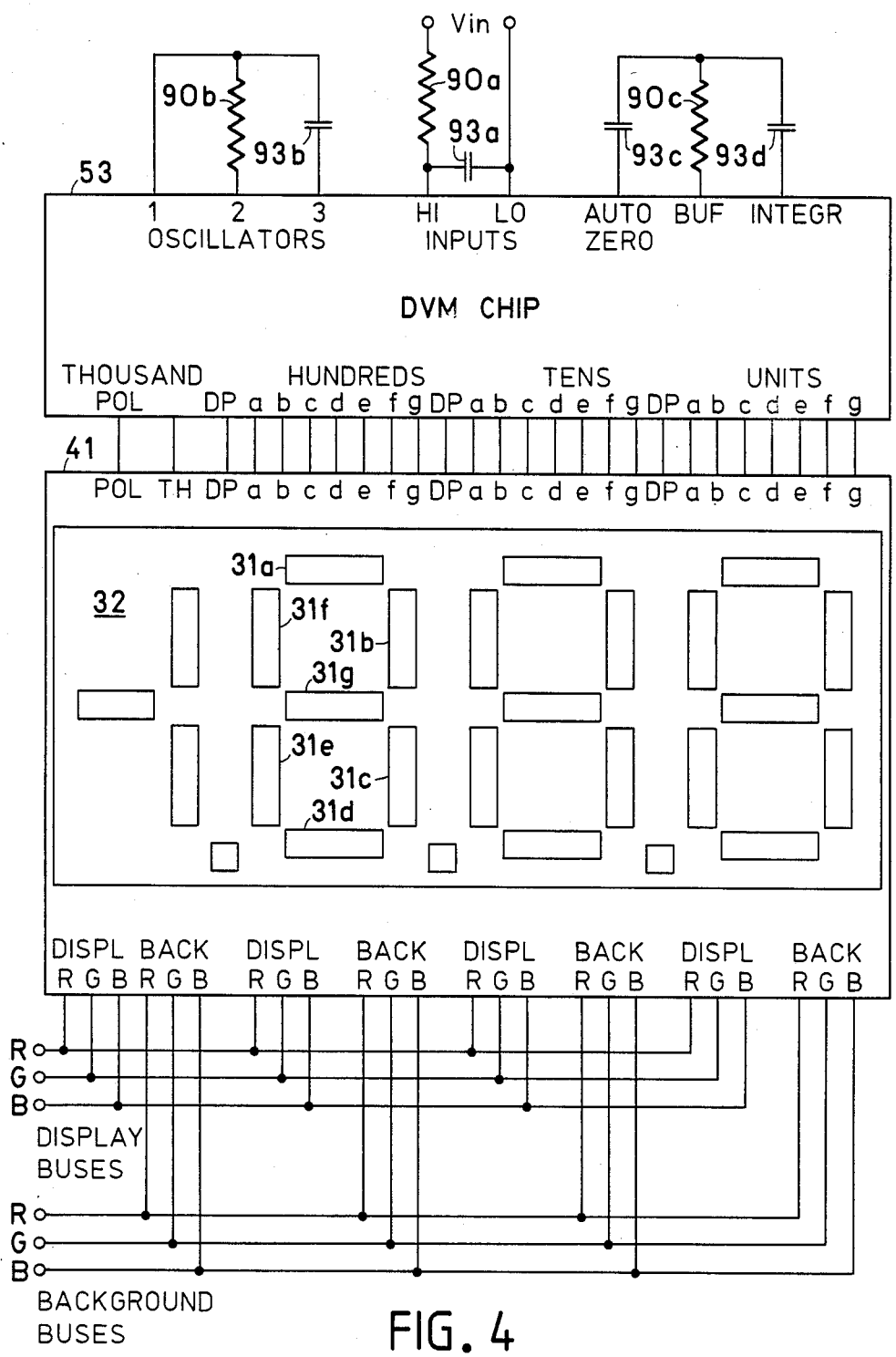
FIG. 4 is a simplified schematic diagram of a digital voltmeter of the invention.

In FIG. 4 is shown a schematic diagram of a digital voltmeter of this invention which includes a DVM (digital voltmeter) chip 53 for measuring input signal Vin applied, via a resistor 90a and decoupling capacitor 93a, to its HI (high) and LO (low) inputs, and for developing segment drive signals a, b, c, d,, e, f, g, and DP (decimal point) for a 3½ digital variable color display 41 on which measured values of the input signal may be indicated in a character format. Resistor 90*b* and capacitor 93*b*, coupled to input OSCILLATORS, are provided for selecting a suitable frequency of internal oscillators. An auto zero capacitor 93*c* tends to decrease noise. Integrating capacitor 93*d* and buffer resistor 90*c* provide desired voltage swing and linearity.

The first display element of the display 41 consists of a figure '1' and a minus sign. The second, third, and fourth display elements consist of seven segments arranged in a well known 7-segment font on which selected characters may be exhibited in variable color. In the second element, the segments are designated as 31*a*, 31*b*, 31*c*, 31*d*, 31*e*, 31*f*, and 31*g*. Each display element has three color control inputs R (red), G (green), and B (blue) designated DISPL. Each display element is surrounded by a variable color background area, as will be more clearly pointed out subsequently. The background area of each display element also has three color control inputs R, G, and B designated as BACK. It is obvious from the illustration that the color control inputs of the display elements and background areas are respectively interconnected to form DISPLAY BUSES R, G, and B, for controlling color of all display elements uniformly, and BACKGROUND BUSES R, G, and B, for controlling color of the entire background area 32 uniformly.

Figure 5:
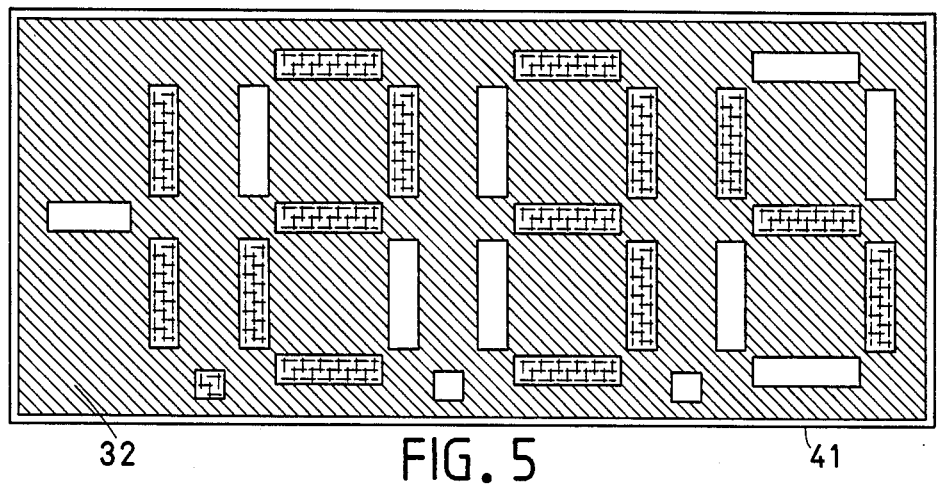
FIG. 5 is an exemplary detail of the display on which measured result is displayed in yellow color on green background.
Figure 6:
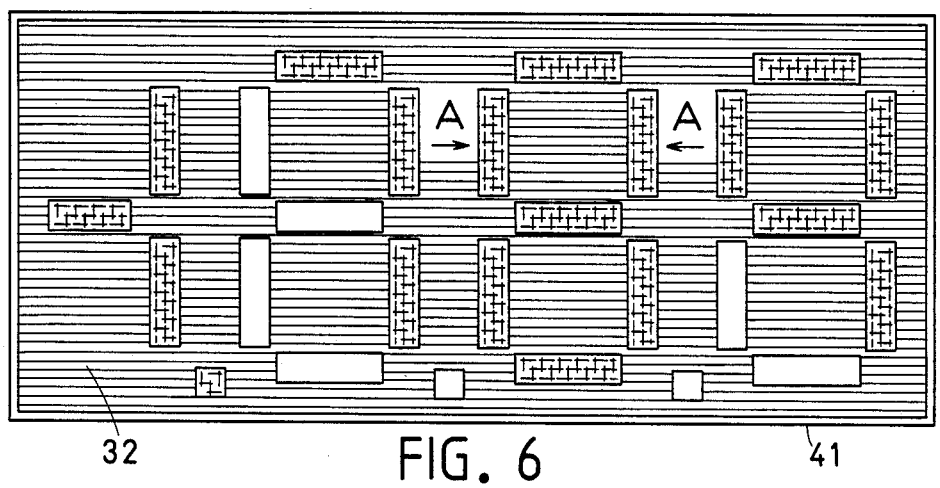
FIG. 6 is a similar detail of the display on which measured result is displayed in yellow color on blue background.
Figure 7:
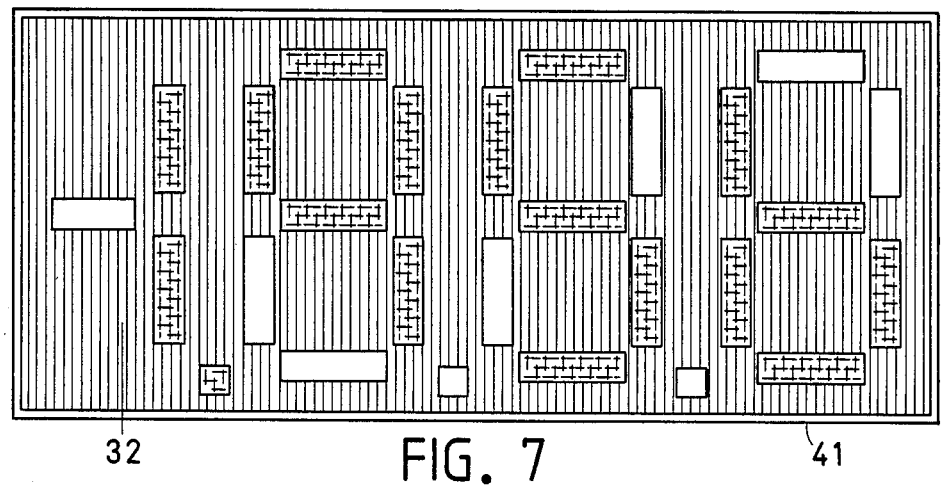
FIG. 7 is a similar detail of the display on which measured result is displayed in yellow color on red background.

FIGS. 5 to 7 are examples of displayed measured values which consider exemplary low limit −1.5 and high limit 1.5 (in Volts or in any other suitable units). The invention resides in controlling the color of background area 32 to indicate whether the measured value lies within the bounds of the low and high limits, below the low limit, or above the high limit. FIG. 5 shows a display on which a measured value 1.234 is displayed on green background, to indicate that it lies within the bounds of the low and high limits. FIG. 6 shows a display on which a measured value −1.789 is displayed on blue background, to indicate that it lies below the low limit. FIG. 7 shows a display on which a measured value 1.956 is displayed on red background, to indicate that it lies above the high limit. To render the illustration less complex, all measured values are displayed in yellow color. It will be appreciated that the color of the display may be also varied, to enhance the presentation, as described in more detail in the above identified copending application.

It is readily apparent that the method of displaying measured values shown in FIGS. 5 to 7 is extremely advantageous. Being completely surrounded by the background area 32, all display elements of the display 41 are distinctly associated therewith. It is perfectly clear that the color of the background area relates only to the values exhibited on the display elements within its boundaries, and not to values exhibited on display elements which may be located outside the boundaries.

Figure 8:
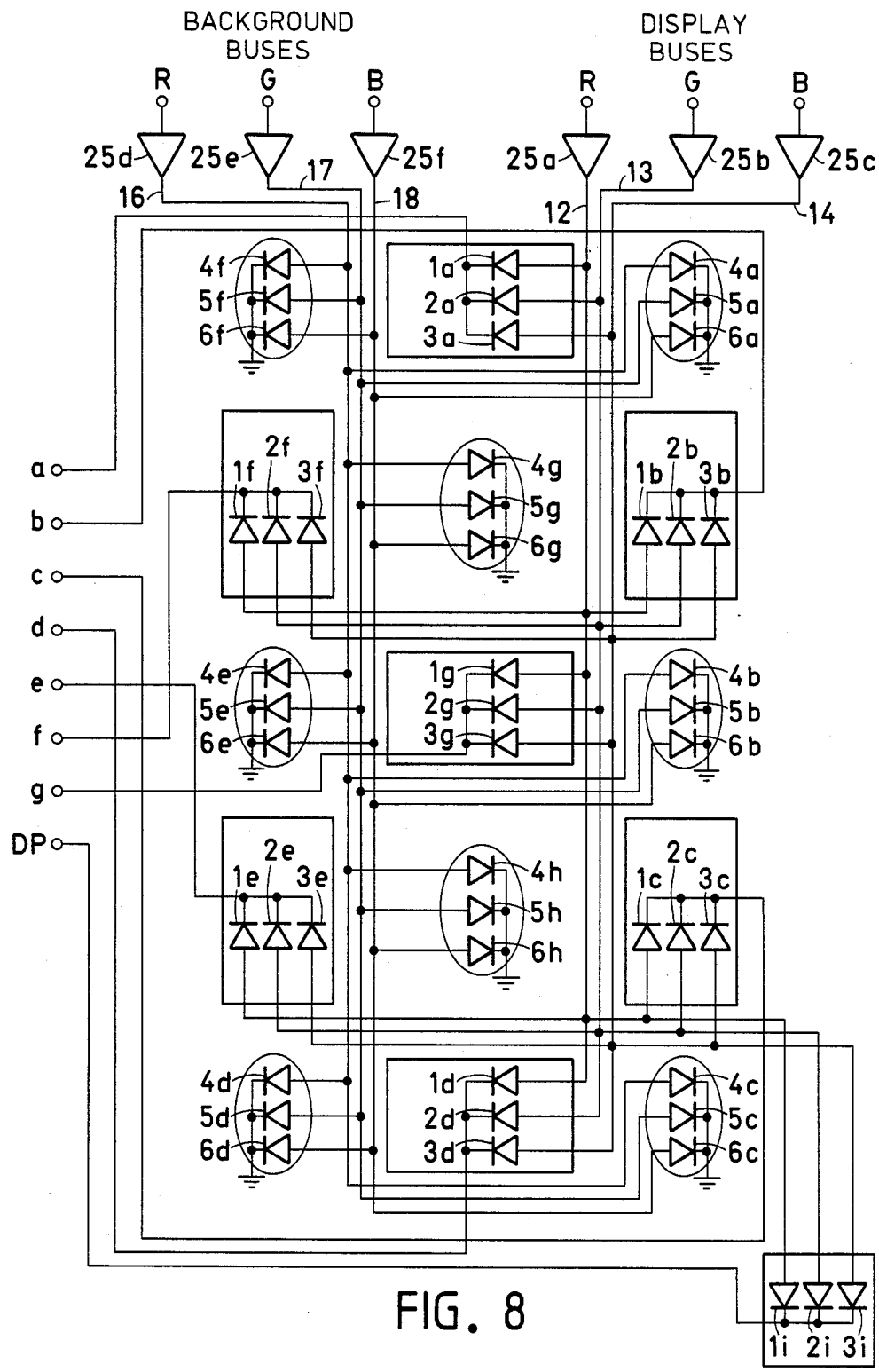
FIG. 8 is a simplified schematic diagram of one element of a variable color display device.

Proceeding now to the detailed description, in FIG. 8 is shown a simplified schematic diagram of a one-character 7-segment variable color display element with variable color background. Each display segment of the display element includes a triad of closely adjacent LEDs: a red LED 1, green LED 2, and blue LED 3 which are adapted for producing a composite light signal of a variable color. To facilitate the illustration, the LEDs are designated by segment letters, e.g., red LED in the segment b is shown at 1*b*, green LED in the segment d is shown at 2*d*, and blue LED in the segment f is shown at 3*f*. The background area is comprised of background regions adjacent the display segments.

Each background region includes a triad of closely adjacent LEDs: a red LED 4, green LED 5, and blue LED 6 which are adapted for producing a composite light signal of a variable color. As much as possible, the LEDs in the background regions are designated by letters of adjacent display segments.

The cathodes of all red, green, and blue display LED triads are interconnected in each display segment and electrically connected to respective inputs a, b, c, d, e, f, g, and DP (decimal point) which may be coupled to the outputs of DVM chip 53 viewed in FIG. 4. The anodes of all display red LEDs 1*a*, 1*b*, 1*c*, 1*d*, 1*e*, 1*f*, 1*g*, and 1*i* are commonly coupled to an electric path referred to as a display red bus 12. The anodes of all display green LEDs 2*a*, 2*b*, 2*c*, 2*d*, 2*e*, 2*f*, 2*g*, and 2*i* are commonly coupled to a like electric path referred to as a display green bus 13. The anodes of all display blue LEDs 3*a*, 3*b*, 3*c*, 3*d*, 3*e*, 3*f*, 3*g*, and 3*i* are commonly coupled to a like electric path referred to as a display blue bus 14.

In a similar fashion, the anodes of all background red LEDs 4*a*, 4*b*, 4*c*, 4*d*, 4*e*, 4*f*, 4*g*, and 4*h* are commonly coupled to an electric path referred to as a background red bus 16. The anodes of all backgroud green LEDs 5*a*, 5*b*, 5*c*, 5*d*, 5*e*, 5*f*, 5*g*, and 5*h* are commonly coupled to a like electric path referred to as a background green bus 17. The anodes of all background blue LEDs 6*a*, 6*b*, 6*c*, 6*d*, 6*e*, 6*f*, 6*g*, and 6*h* are commonly coupled to a like electric path referred to as a background blue bus 18. The cathodes of all red, green, and blue LED triads in each background region are grounded.

The display red bus 12 is connected to the output of a non-inverting buffer 25*a* capable of sourcing sufficient current to illuminate all display red LEDs. The display green bus 13 is connected to the output of a like buffer 25*b*. The display blue bus 14 is connected to the output of a like buffer 25*c*. The background red bus 16 is connected to the output of a like buffer 25*d*. The background green bus 17 is connected to the output of a like buffer 25*e*. The background blue bus 18 is connected to the output of a like buffer 25*f*. It would be obvious to those skilled in the art that current limiting resistors may be connected in series with all LEDs in the circuit to constrain current flow.

The operation of the display element shown in FIG. 4 will be now explained on example of illuminating digit '1' in yellow color. To exhibit decimal number '1', low voltage levels are applied to the inputs b and c, to illuminate equally designated segments, and high voltage levels are applied to all remaining inputs, to extinguish all remaining segments.

To illuminate the display element in yellow color, the color control inputs R and G of the display buses are raised to a high logic level, while color control input B is maintained at a low logic level. As a result, the outputs of buffers 25*a* and 25*b* rise to a high logic level. The current flows from the output of buffer 25*a*, via display red bus 12 and red LED 1*b*, to the input b, and, via red LED 1*c*, to the input c. The current also flows from the output of buffer 25*b*, via display green bus 13 and green LED 2*b*, to the input b, and, via green LED 2*c*, to the input c. As a result of blending light signals of red and green colors in the segments b and c, the segments illuminate in substantially yellow color, creating a visual impression of a character '1'.

To illuminate the background area in green color, the color control input G of the background buses is raised to a high logic level, while the remaining color control inputs R and B are low. As a result, the output of buffer 25e rises to a high logic level. The current flows therefrom via background green bus 17 and green LEDs 5a, 5b, 5c, 5d, 5e, 5f, 5g, and 5h in all background regions, to ground. The entire background area illuminates in green color.

To illuminate the background area in blue color, the color control input B of the background buses is raised to a high logic level, while the remaining color control inputs R and G are low. As a result, the output of buffer 25f rises to a high logic level. The current flows therefrom, via background blue bus 18 and blue LEDs 6a, 6b, 6c, 6d, 6e, 6f, 6g, and 6h in all background regions, to ground. The entire background area illuminates in blue color.

To illuminate the background area in red color, the color control input R of the background buses is raised to a high logic level, while the remaining color control inputs G and B are low. As a result, the output of buffer 25d rises to a high logic level. The current flows therefrom, via background red bus 16 and red LEDs 4a, 4b, 4c, 4d, 4e, 4f, 4g, and 4h in all background regions, to ground. The entire background area illuminates in red color.

Figure 9:
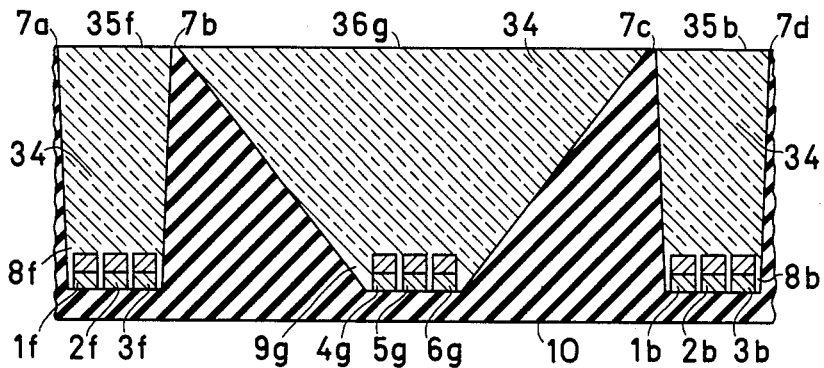
FIG. 9 is a cross-sectional view, taken along the line A—A in FIG. 6, revealing internal structure of a portion of a variable color display device.

An important consideration has been given to physical arrangement of the LEDs in the display areas and background regions, as illustrated in FIG. 9. Display red LED 1f, green LED 2f, and blue LED 3f are disposed on a support 10 in a display light blending cavity 8f and completely surrounded by transparent light scattering material 34. When forwardly biased, the LEDs 1f, 2f, and 3f emit light signals of red, green, and blue colors, respectively, which are blended by passing through light scattering material 34, acting to disperse the light signals, to form a composite light signal that emerges at the upper surface 35f. The color of the composite light signal may be controlled by varying the portions of red, green, and blue light signals. Display red LED 1b, green LED 2b, and blue LED 3b are similarly disposed in a display light blending cavity 8b and may be similarly activated.

In a similar fashion, background red LED 4g, green LED 5g, and blue LED 6g are disposed on the support 10 in a background light blending cavity 9g and surrounded by transparent light scattering material 34. When forwardly biased, the LEDs 4g, 5g, and 6g emit light signals of red, green, and blue colors, respectively, which are blended by passing through the light scattering material 34 to form a composite light signal of a composite color that emerges at the upper surface 36g.

The display light blending cavities are optically separated from adjacent background light blending cavities by opaque walls. The display light blending cavity 8f is defined by walls 7a and 7b. The walls have generally smooth inclined surfaces defining an obtuse angle with the support 10. The walls 7b and 7c similarly define a background light blending cavity 9g therebetween. In a similar fashion, the display light blending cavity 8b is defined by the walls 7c and 7d. The width of the top surfaces of the opaque walls is uniform and distinctly less than the width of the display areas or background regions so as to minimize the boundaries therebetween. The top surfaces of the opaque walls and top surfaces of the display areas and background regions are in the same plane to allow wide angle observation of the display device. Although the walls and light blending cavities are shown to be of certain shapes and dimensions, it is envisioned that they may be modified and rearranged.

Figure 10:
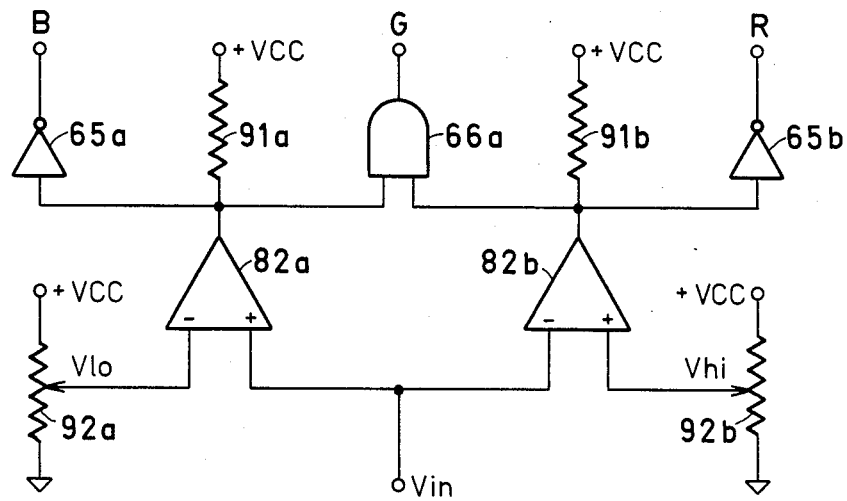
FIG. 10 is a schematic diagram of an analog comparator for developing color control signals.

In FIG. 10, the input signal Vin is applied to the interconnected inputs of two analog comparators 82a, 82b in a classic 'window' comparator configuration. When the input voltage is lower than the low voltage limit Vlo, set by a potentiometer 92a, the output of comparator 82a drops to a low logic level, thereby forcing the output of an inverter 65a to rise to a high logic level to develop active color control signal B.

When the input voltage is higher than the high voltage limit Vhi, set by a potentiometer 92b, the output of comparator 82b drops to a low logic level, thereby forcing the output of an inverter 65b to rise to a high logic level to develop active color control signal R.

When the input voltage is between the low voltage limit Vlo and high voltage limit Vhi, the outputs of comparators 82a, 82b rise to a high logic level (pull-up resistors 91a, 91b ensure correct high and low levels), thereby causing the output of AND gate 66 to rise to a high logic level to develop active color control signal G. The outputs B, G, and R may be respectively coupled to like inputs of the background buses in FIG. 4 to cause the background area 32 to illuminate in one of three colors in accordance with the range in which the measured voltage lies.

Figure 11:
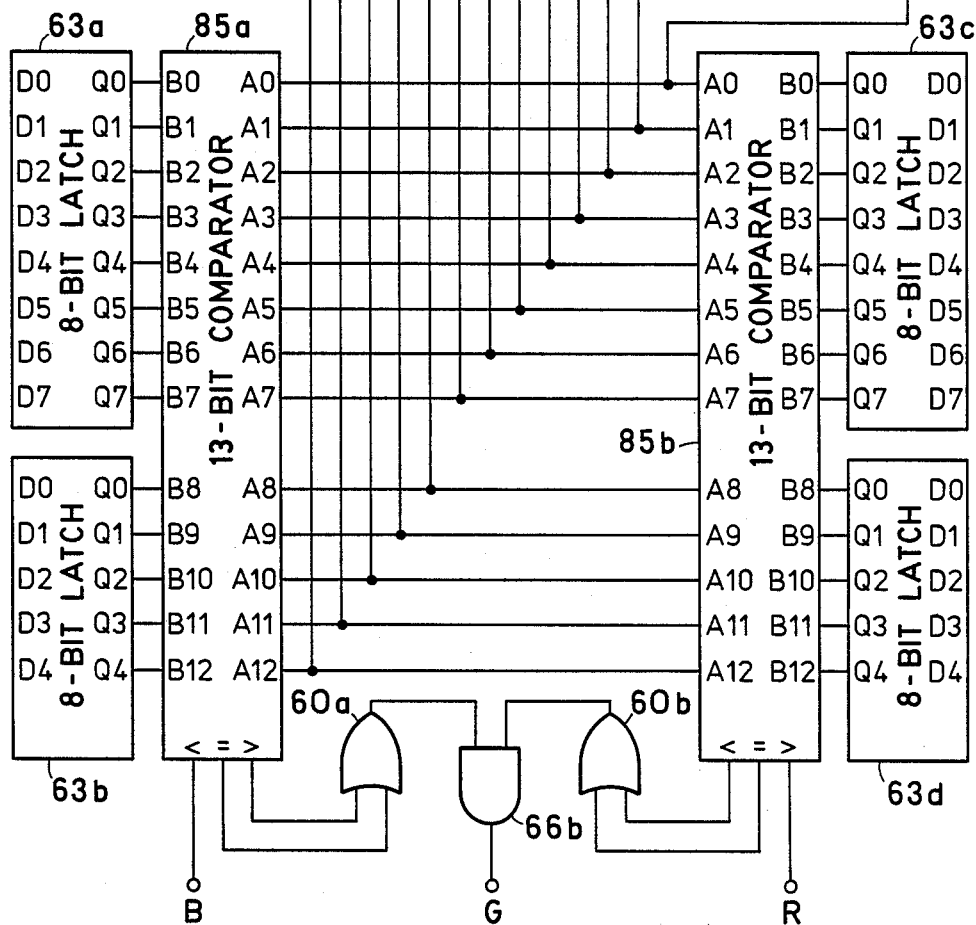
FIG. 11 is a schematic diagram of a digital comparator for developing color control signals.

In FIG. 11 is shown a schematic diagram of a digital voltmeter with a comparator for developing color control signals. A DVM chip 54 measures input signal Vin applied via a resistor 90f to its input IN and develops at its outputs A, B, C, D of Units, Tens, Hundreds, and Thousand digital data corresponding to the value of measured input signal. The input INIT CONV (initiate conversion) is tied to a high logic level for causing the DVM chip to measure continuously. The output digital data are simultaneously applied to the inputs A0 to A12 of a 13-bit digital comparator 85a and to the inputs A0 to A12 of a like comparator 85b. Two 8-bit latches 63a, having its outputs Q0 to Q7 respectively coupled to the inputs B0 to B7 of comparator 85a, and 63b, having its outputs Q0 to Q4 respectively coupled to the inputs B8 to B12 of comparator 85a, are provided for storing a digital representation of a low limit. Two like latches 63c, having its outputs Q0 to Q7 respectively coupled to the inputs B0 to B7 of comparator 85b, and 63d, having its outputs Q0 to Q4 respectively coupled to the inputs B8 to B12 of comparator 85b, are provided for storing a digital representation of a high limit. The comparator 85a effects a comparison of the output digital data with the low limit and develops comparison signals accordingly. The comparator 85b effects a comparison of the output digital data with the high limit and develops comparison signals accordingly. It would be obvious that data in the latches may be readily changed by applying new data to the inputs D0 to D7 and clocking same into the latches (not shown).

When the output digital data of DVM chip 54 are less than the low limit, the output '<' of comparator 85a rises to a high logic level to generate an active color control signal B. When the digital data are greater than the high limit, the output '>' of comparator 85b rises to a high logic level to generate an active color control signal R. When the digital data are within the bounds of the low and high limits, one of the outputs '=' and '>' of comparator 85a, which are gated by an OR gate 60a, and one of the outputs '<' and '=' of comparator 85b, which are gated by an OR gate 60b, rise to a high logic level to force both inputs of an AND gate 66b to rise to a high logic level. As a consequence, the output of AND gate 66D rises to a high logic level to generate active color control signal G. The comparison outputs B, G, and R may be respectively coupled to like inputs of the background buses in FIG. 4 for causing the background area 32 of the display 41 to illuminate either in blue color when the measured value is less than the low limit, in red color when the measured value is greater than the high limit, or in green color when the measured value is within the bounds of the low and high limits. It would be obvious that the color sequences could be readily changed by differently interconnecting the comparison outputs with the background color control inputs.

Figure 12:
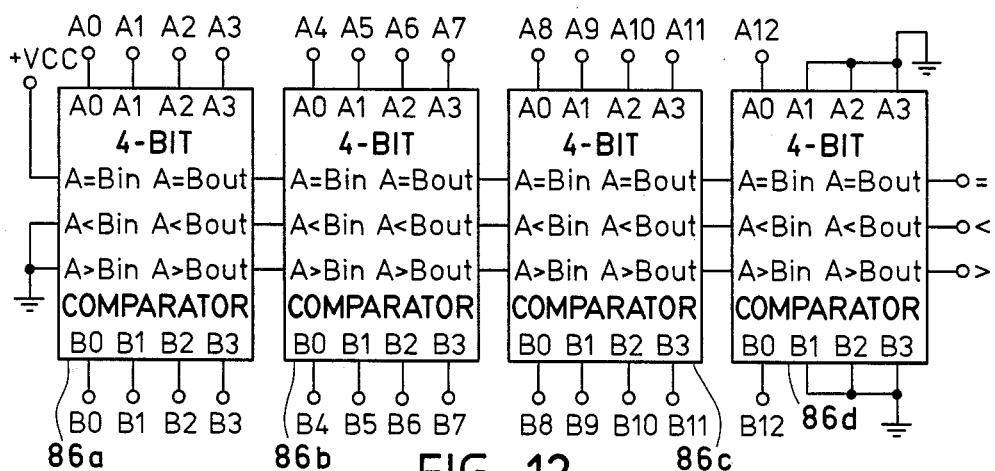
FIG. 12 is a detail of 13-bit digital comparator in FIG. 11.

FIG. 12 is a detail of one of 13-bit digital comparators 85a, 85b in FIG. 11. It will be appreciated that both comparators may be substantially same. The comparison inputs '<', '=', and '>' of four 4-bit digital comparators 86a, 86b, 86c, and 86d are respectively coupled to like preceding outputs, in a manner well understood by those skilled in the art, to extend the comparison range to 13 bits.

The invention may be now briefly summarized. The method was disclosed of simultaneously indicating a measured value and its significance, on display means surrounded by variable color background area, by causing the measured value to be indicated on the display means in a character format and by controlling color of the background area in accordance with the significance of the measured value.

A digital voltmeter was disclosed that comprises an analog to digital converter for producing digital data proportional to an input signal, display for indicating the digital data in a character format, and a variable color background area substantially surrounding the display. Comparator is provided for interrogating the significance of the value of the input signal and for developing comparison signals accordingly. Background color control means illuminate the background area in a color in accordance with the comparison signals.

All matter herein described and illustrated in the accompanying drawings should be interpreted as illustrative and not in a limiting sense. It would be obvious that numerous modifications can be made in the construction of the preferred embodiments shown herein, without departing from the spirit of the invention as defined in the appended claims. It is contemplated that the principles of the invention may be also applied to numerous diverse types of display devices, such are liquid crystal, plasma devices, and the like.

CORRELATION TABLE

This is a correlation table of reference characters used in the drawings herein, their descriptions, and examples of commercially available parts.

| # | DESCRIPTION | EXAMPLE |
|---|---|---|
| 1 | display red LED | |
| 2 | display green LED | |
| 3 | display blue LED | |
| 4 | background red LED | |
| 5 | background green LED | |
| 6 | background blue LED | |
| 7 | opaque wall | |

CORRELATION TABLE-continued

This is a correlation table of reference characters used in the drawings herein, their descriptions, and examples of commercially available parts.

| # | DESCRIPTION | EXAMPLE |
|---|---|---|
| 8 | display light blending cavity | |
| 9 | background light blending cavity | |
| 10 | support | |
| 11 | variable color display | |
| 12 | display red bus | |
| 13 | display green bus | |
| 14 | display blue bus | |
| 16 | background red bus | |
| 17 | background green bus | |
| 18 | background blue bus | |
| 21 | segment color control | |
| 22 | background color control | |
| 23 | display decoder | |
| 25 | non-inverting buffer | 74LS244 |
| 31 | display segment | |
| 32 | background area | |
| 34 | light scattering material | |
| 35 | top surface of display area | |
| 36 | top surface of background area | |
| 41 | 3½ digit variable color display | |
| 51 | A/D converter | |
| 53 | Teledyne DVM chip | TSC7107 |
| 54 | Teledyne DVM chip | TSC8750 |
| 60 | 2-input OR gate | 74HC32 |
| 63 | 8-bit latch | 74HC373 |
| 65 | inverter | 74HC04 |
| 66 | 2-input AND gate | 74HC08 |
| 81 | analog comparator | |
| 82 | analog comparator chip | LM339 |
| 84 | digital comparator | |
| 85 | 13-bit digital comparator | |
| 86 | 4-bit digital comparator | 74HC85 |
| 90 | resistor | |
| 91 | resistor | |
| 92 | potentiometer | |
| 93 | capacitor | |

What I claim is:

1. A method of indicating a measured value, on display means including a plurality of adjacent display elements, each said display element including a display area and a variable color background area substantially surrounding said display area, each said background area having color control inputs for controlling its color, the color control inputs of said background areas being respectively interconnected, by causing an indication of said measured value to be exhibited on said display areas in a first color and by activating the interconnected color control inputs of said background areas to illuminate them in a uniform second color, whereby the color of said background areas effectively indicates that it relates to the indication of said measured value.

2. A method of indicating a measured value, on a character display means including a plurality of adjacent display elements, each said display element including a character display area and a variable color background area substantially surrounding said display area, each said background area having color control inputs for controlling its color, the color control inputs of said background areas being respectively interconnected, by causing a character indication of said measured value to be exhibited on said display areas in a first color and by activating the interconnected color control inputs of said background areas to illuminate them in a uniform second color, whereby the color of said background areas effectively indicates that it relates to the character indication of said measured value.

* * * * *